(12) United States Patent
Takahashi et al.

(10) Patent No.: US 12,495,511 B2
(45) Date of Patent: Dec. 9, 2025

(54) ELECTRONIC CONTROL DEVICE

(71) Applicant: Hitachi Astemo, Ltd., Hitachinaka (JP)

(72) Inventors: Yusuke Takahashi, Hitachinaka (JP); Yoshio Kawai, Hitachinaka (JP)

(73) Assignee: Hitachi Astemo, Ltd., Ibaraki (JP)

( * ) Notice: Subject to any disclaimer, the term of this patent is extended or adjusted under 35 U.S.C. 154(b) by 121 days.

(21) Appl. No.: 18/038,319

(22) PCT Filed: Sep. 24, 2021

(86) PCT No.: PCT/JP2021/035128
§ 371 (c)(1),
(2) Date: May 23, 2023

(87) PCT Pub. No.: WO2022/190437
PCT Pub. Date: Sep. 15, 2022

(65) Prior Publication Data
US 2024/0008207 A1    Jan. 4, 2024

(30) Foreign Application Priority Data

Mar. 10, 2021   (JP) .................................. 2021-038527

(51) Int. Cl.
*H05K 5/06* (2006.01)
*B60R 16/02* (2006.01)
(Continued)

(52) U.S. Cl.
CPC ............... *H05K 5/065* (2013.01); *H05F 3/02* (2013.01); *H05K 5/0052* (2013.01); *H05K 5/006* (2013.01);
(Continued)

(58) Field of Classification Search
CPC ...... H05K 5/065; H05K 5/0052; H05K 5/006; H05K 5/0069; H05K 5/04; H05K 9/0067;
(Continued)

(56) References Cited

U.S. PATENT DOCUMENTS 6,407,925 B1 *   6/2002   Kobayashi ........... H05K 5/0052
                                                361/752
7,257,003 B2 *   8/2007   Ono ....................... H05K 5/061
                                                174/16.3
(Continued)

FOREIGN PATENT DOCUMENTS

JP    H08-97584 A    4/1996
JP    H08-97854 A    4/1996
(Continued)

OTHER PUBLICATIONS

PCT/JP2021/035128 International Search Report, Nov. 30, 2021, 3 pgs.

(Continued)

*Primary Examiner* — Allen L Parker
*Assistant Examiner* — Martin Antonio Asmat Uceda
(74) *Attorney, Agent, or Firm* — Volpe Koenig

(57) ABSTRACT

An electronic control device includes a non-conductive resin housing; a circuit board; a metal housing; a waterproof seal material; and a conductive adhesive. The circuit board has a circuit ground (GND pattern), and is held by the resin housing. The metal housing covers the circuit board and is attached to the resin housing. The waterproof seal material seals and waterproofs the resin housing and the metal housing. The conductive adhesive is in contact with the metal housing and the circuit ground, and electrically connects the metal housing to the circuit ground at a plurality of points.

17 Claims, 17 Drawing Sheets

(51) Int. Cl.
*H05F 3/02* (2006.01)
*H05K 5/00* (2025.01)
*H05K 5/04* (2006.01)
*H05K 9/00* (2006.01)

(52) U.S. Cl.
CPC ............ H05K 5/0069 (2013.01); H05K 5/04 (2013.01); H05K 9/0067 (2013.01); B60R 16/02 (2013.01)

(58) Field of Classification Search
CPC .. H05K 1/0215; H05K 5/0017; H05K 5/0026; H05K 5/0047; H05K 5/061; H05K 5/069; B60R 16/02; B60R 16/0239; H01R 12/716; H01R 13/518; H01R 24/76
See application file for complete search history.

(56) References Cited

U.S. PATENT DOCUMENTS

| | | | | |
|---|---|---|---|---|
| 7,259,969 | B2 * | 8/2007 | Zarganis | H05K 9/003 361/800 |
| 7,417,873 | B2 * | 8/2008 | Kadoya | H05K 1/189 257/E25.031 |
| 7,791,888 | B2 * | 9/2010 | Tominaga | H01L 25/072 361/708 |
| 8,107,242 | B2 * | 1/2012 | Yoshimoto | H05K 5/065 361/721 |
| 8,139,364 | B2 * | 3/2012 | Wickett | H05K 5/0039 361/752 |
| 8,520,397 | B2 * | 8/2013 | Azumi | H05K 5/0069 361/752 |
| 9,281,607 | B2 * | 3/2016 | Lee | H01R 13/5202 |
| 9,480,189 | B2 * | 10/2016 | Kawai | H01L 23/3675 |
| 9,795,053 | B2 * | 10/2017 | Sanada | H05K 7/20127 |
| 10,188,005 | B2 * | 1/2019 | Albert | H05K 5/0069 |
| 10,194,548 | B2 * | 1/2019 | Ishikawa | H05K 5/065 |
| 10,201,108 | B2 * | 2/2019 | Lee | B60R 16/0239 |
| 10,212,831 | B2 * | 2/2019 | Karszt | H05K 5/006 |
| 10,729,021 | B1 * | 7/2020 | Sanchez | H01R 12/721 |
| 2009/0251843 | A1 * | 10/2009 | Hironaka | H05K 9/0067 361/216 |
| 2010/0103632 | A1 * | 4/2010 | Kato | H05K 5/006 361/752 |
| 2013/0215582 | A1 * | 8/2013 | Dittrich | H05K 5/061 361/752 |
| 2014/0016242 | A1 * | 1/2014 | Hattori | H05K 1/181 361/303 |
| 2014/0334115 | A1 * | 11/2014 | Yang | B60R 16/0238 361/752 |
| 2015/0264829 | A1 * | 9/2015 | Christoph | H05K 1/0215 361/753 |
| 2016/0033621 | A1 * | 2/2016 | Ottenhues | G01S 7/032 342/175 |
| 2016/0165736 | A1 * | 6/2016 | Tsuboi | H02K 11/33 174/50.54 |
| 2016/0174404 | A1 * | 6/2016 | Kang | H05K 5/061 312/223.1 |
| 2019/0044452 | A1 * | 2/2019 | Arita | H02M 1/32 |
| 2019/0223287 | A1 | 7/2019 | Nishida et al. | |
| 2019/0252953 | A1 * | 8/2019 | Tsuboi | H02K 5/10 |
| 2019/0380226 | A1 * | 12/2019 | Kojima | H05K 7/2049 |
| 2020/0236797 | A1 * | 7/2020 | Stilianos | H05K 5/066 |

FOREIGN PATENT DOCUMENTS

| | | | | |
|---|---|---|---|---|
| JP | H10-107476 | A | | 4/1998 |
| JP | 2007-005356 | A | | 1/2007 |
| JP | 2009-077211 | A | | 4/2009 |
| JP | 2014220921 | A | * | 11/2014 |
| JP | 2015-220153 | A | | 12/2015 |
| JP | 6277061 | B2 | * | 2/2018 |
| JP | 6302093 | B2 | * | 3/2018 ......... B60R 16/0239 |
| JP | 2019-125668 | A | | 7/2019 |
| JP | 2019-133858 | A | | 8/2019 |

OTHER PUBLICATIONS

Notification of Transmittal of Copies of Translation of the International Preliminary Report on Patentability. issued on Sep. 21, 2023 for PCT International Application No. PCT/JP2021/035128.

* cited by examiner (COMPARATIVE EXAMPLE 1)

(COMPARATIVE EXAMPLE 2)

A - A

A - A

A - A

A - A v1 < v9

A - A

A - A

A - A

RECTANGULAR

ARCUATE

U-SHAPED

DETAILED VIEW: C

A - A

DETAILED VIEW: D

A - A

RECTANGULAR

ARCUATE

U-SHAPED

ELECTRONIC CONTROL DEVICE

TECHNICAL FIELD

The present invention relates to an electronic control device.

BACKGROUND ART

In recent years, for the purpose of making vehicles more lightweight, and so forth, an in-vehicle electronic control device has been afforded a direct-fixing structure in which the length of connecting cables between a control device and a sensor and between actuators is shortened, and advances in resinification of the housing have been made (see, for example, Patent Literature 1). The direct-fixing structure of the in-vehicle electronic control device is directly fixed to the engine body, directly fixed to the transmission, or the like. The resinification of the housing serves to lighten the weight by replacing the metal material, which has a high specific gravity and has often been used in the related art, with a resin material.

Here, when the electronic control device is mounted in a vehicle while the assembly worker is electrically charged, static electricity is applied to the electronic component via the housing of the electronic control device, which risks damaging the electronic component.

Patent Literature 1 discloses a structure in which a protruding structure protruding from a metal housing is provided, and the convex structure is brought close to a circuit board to be grounded.

CITATION LIST

Patent Literature

PTL 1: JP 2019-133858 A

SUMMARY OF INVENTION

Technical Problem

In the electronic control device disclosed in Patent Literature 1, in a case where there is a space between the protruding structure of the metal housing and the circuit board, there is a problem that the impedance increases and the noise resistance performance deteriorates.

An object of the present invention is to provide an electronic control device capable of discharging static electricity, which is applied to a metal housing, to a circuit ground at a low impedance.

Solution to Problem

In order to achieve the above object, an electronic control device of the present invention includes: a non-conductive resin housing; a circuit board having a circuit ground and held by the resin housing; a conductive metal housing that covers the circuit board and that is attached to the resin housing; a waterproof seal material that seals and waterproofs the resin housing and the metal housing; and a conductive adhesive that is in contact with the metal housing and the circuit ground and that electrically connects the metal housing to the circuit ground at a plurality of points.

Advantageous Effects of Invention

With the present invention, static electricity applied to the metal housing can be discharged to the circuit ground at a low impedance. Problems, configurations, and advantageous effects other than the above will be clarified by the following embodiments.

DESCRIPTION OF EMBODIMENTS

Figure 1:
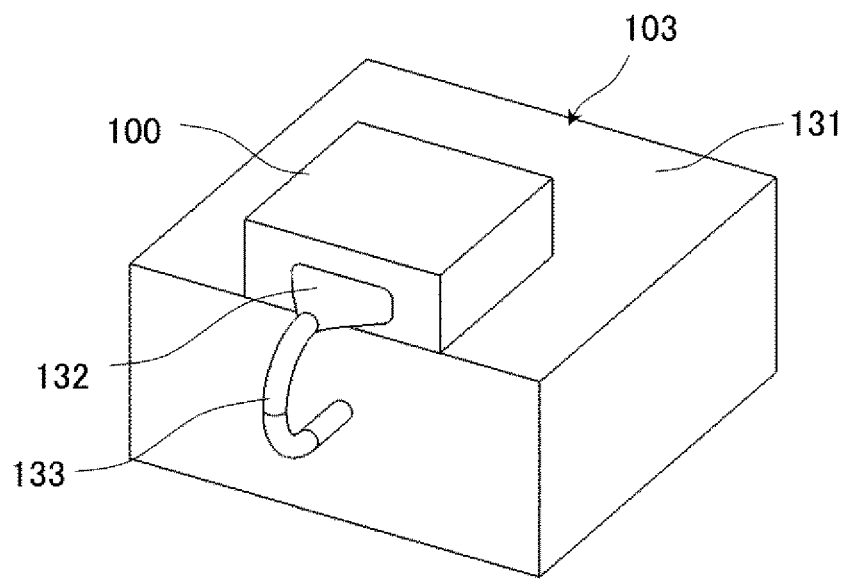
FIG. 1 is a schematic perspective view of a transmission to which an electronic control device is attached.
Figure 2:
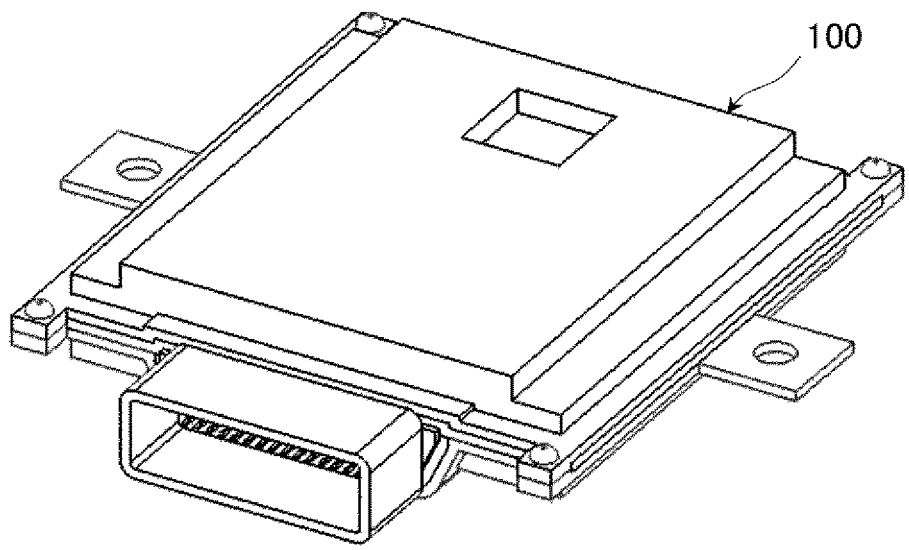
FIG. 2 is a perspective view of an electronic control device according to an embodiment of the present invention.
Figure 3:
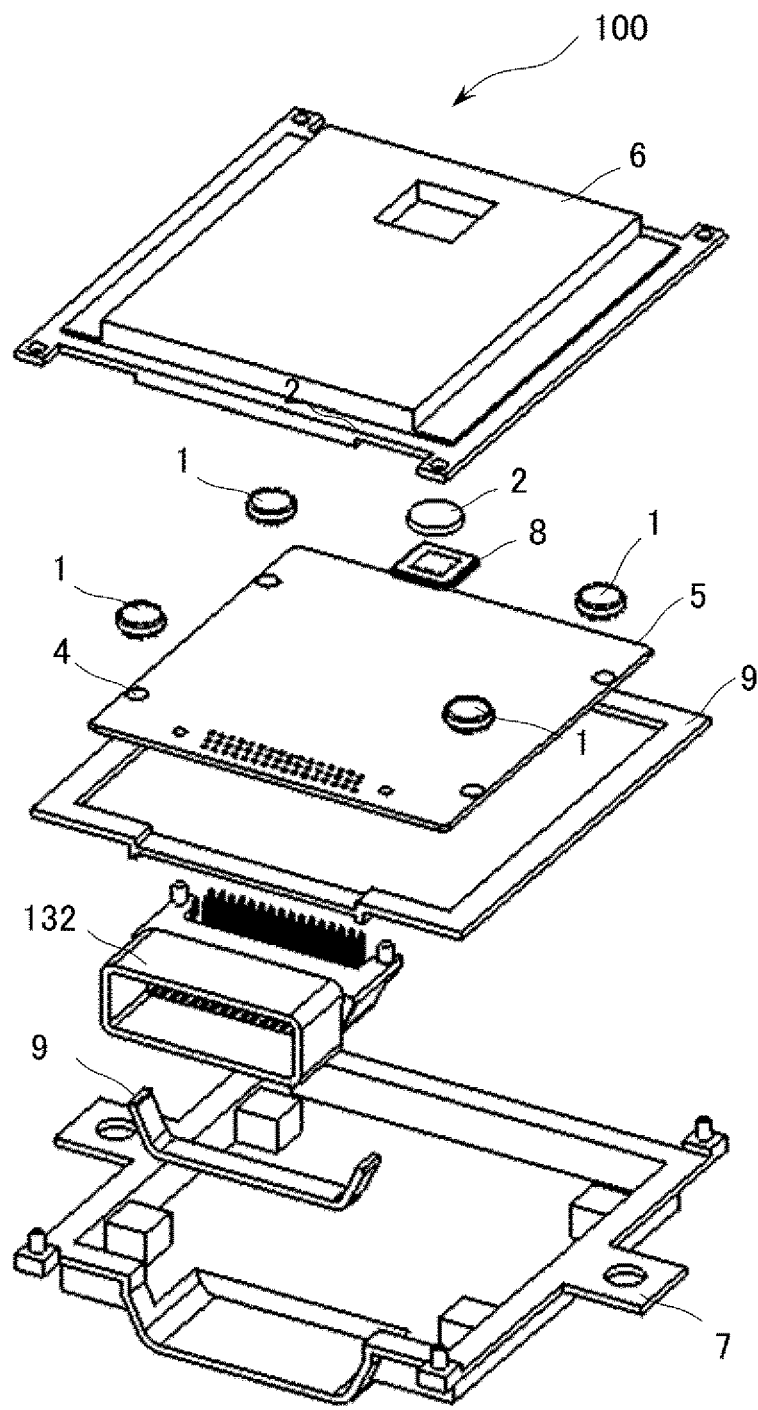
FIG. 3 is an exploded perspective view of an electronic control device according to an embodiment of the present invention.

Hereinafter, embodiments of an electronic control device according to the present invention will be cited and described in detail with reference to the accompanying drawings. An electronic control device controls, for example, an actuator (electromagnetic valve or the like) used for an engine, a transmission, and the like. Note that, in the drawings, the same reference signs denote the same parts.

The purpose of the present embodiment is to provide an ESD (Electro-Static Discharge) countermeasure structure in a case where the material of an electronic control device on the vehicle-fixing side is replaced with a resin material and where a conductive adhesive is arranged between a metal housing and a circuit board, and an electronic control device that enables mixing with a waterproof seal material to be suppressed while achieving a more compact unit size, even in a case where there is wet-spreading of the conductive adhesive.

Comparative Example

First, configurations of an electronic control device according to the present invention and according to a comparative example thereof will be described with reference to FIGS. 1, 4A, 4B, 5A, and 5B.

Where the direct-fixing structure of the electronic control device is concerned, for example, an example of a direct-fixing structure in the transmission is shown in FIG. 1. In FIG. 1, a transmission 103 includes a mechanism (not illustrated) that changes a rotational driving force of an engine or the like and transmits the rotational driving force, and a transmission case 131 that accommodates the mechanism. The electronic control device 100 is attached to the transmission case 131. The transmission connectors 132 (on the electronic control device side and the transmission side) are electrically connected by a connecting cable 133.

Figure 4A:
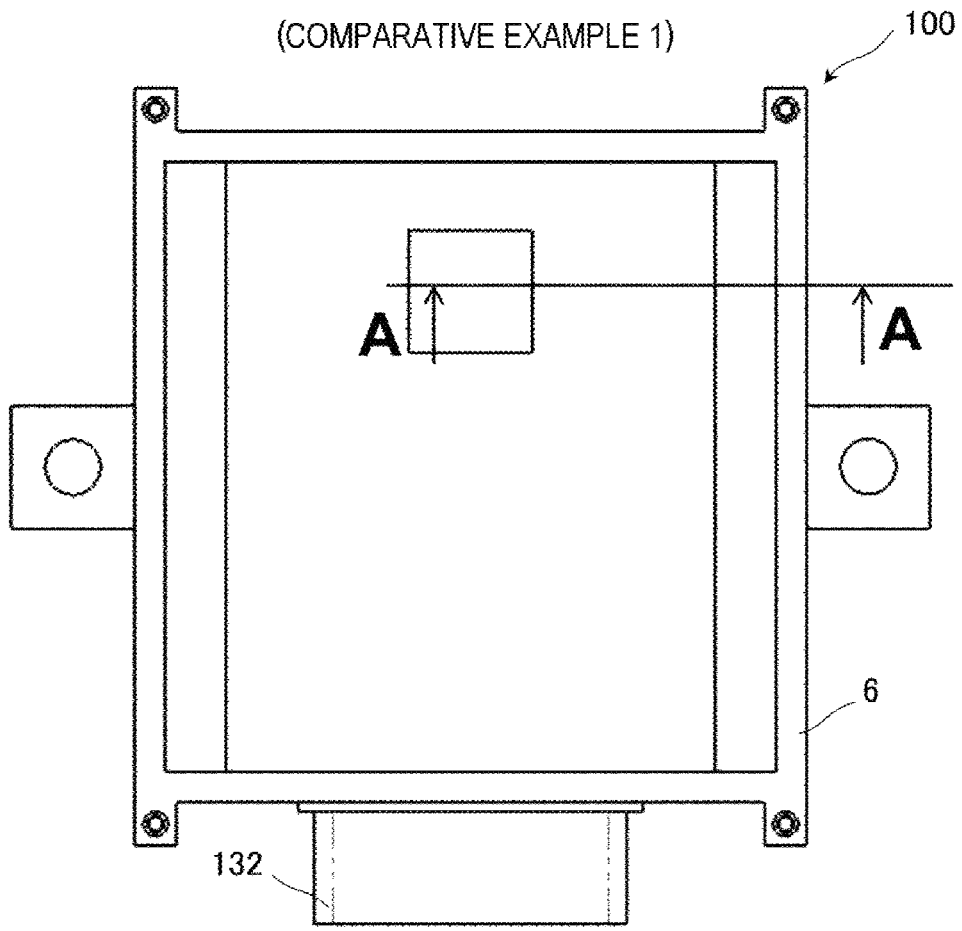
FIG. 4A is a top view of an electronic control device according to a first comparative example.
Figure 4B:
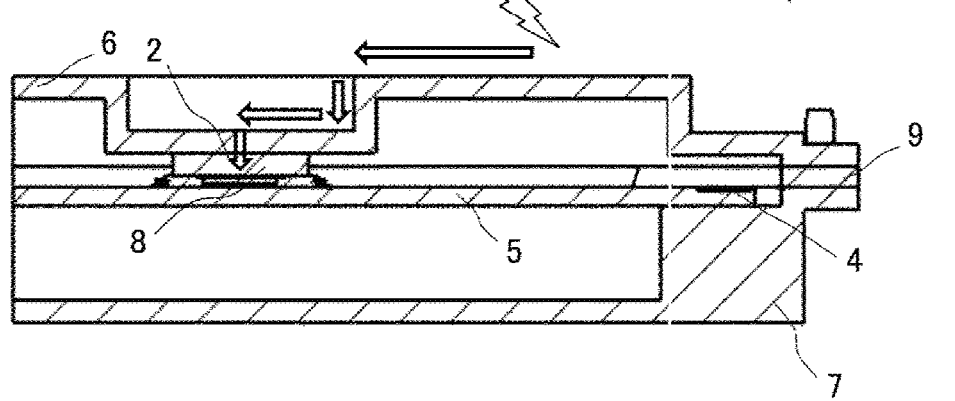
FIG. 4B is a cross-sectional view of the electronic control device shown in FIG. 4A.

Here, when the electronic control device 100 is mounted in the vehicle in a state where the assembly worker is electrically charged, static electricity is applied to the electronic component 8 via the housing (metal housing 6) of the electronic control device, as shown in FIGS. 4A and 4B, which risks damaging the electronic component 8.

In a case where the member (resin housing 7) of the electronic control device on the vehicle fixing side is an insulator resin and the circuit board 5 is attached to the resin, static electricity does not flow to the vehicle ground side. Therefore, it is necessary to control the metal housing 6 and the circuit board 5 with a narrow clearance and for static electricity to flow to the vehicle ground side. However, there is a problem that impedance increases and noise resistance performance is poor. Therefore, a structure may be considered in which a conductive adhesive 1 is arranged between the metal housing 6 and the circuit board 5 in order to use reliable grounding to improve the noise resistance performance.

Figure 5A:
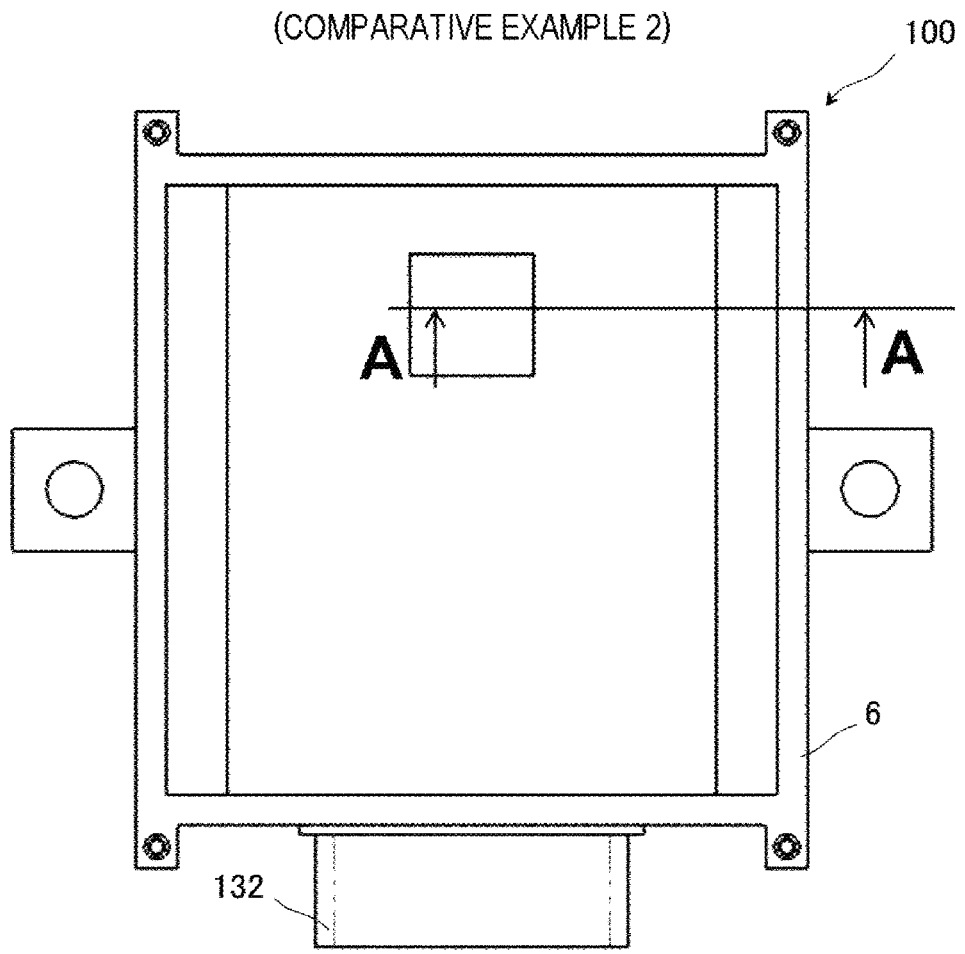
FIG. 5A is a top view of an electronic control device according to a second comparative example.
Figure 5B:
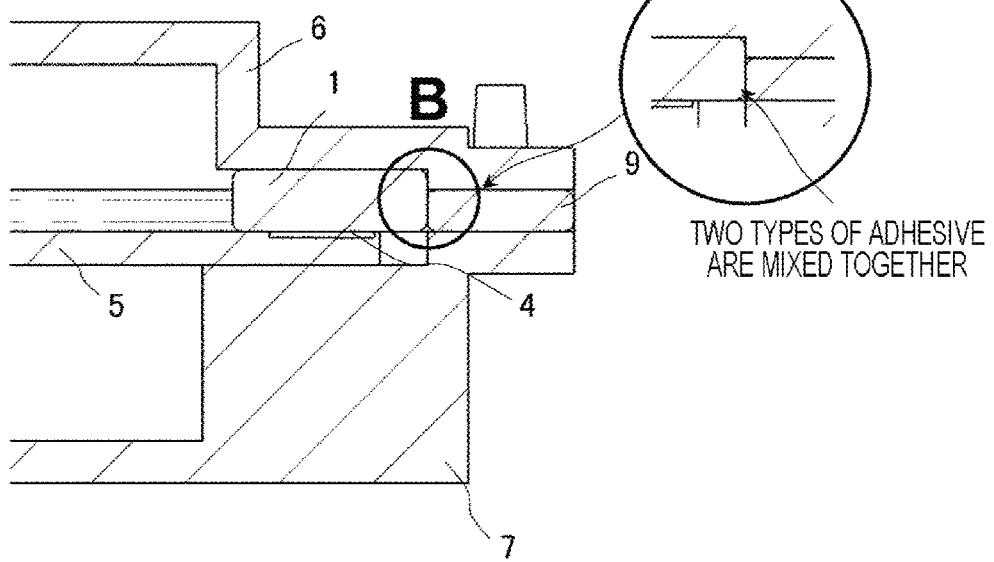
FIG. 5B is a cross-sectional view of the electronic control device shown in FIG. 5A.

However, because the conductive material (conductive adhesive 1) shown in FIG. 5B may cause a short-circuit failure upon coming into contact with the electronic component 8, it is necessary to set in place a component prohibition band around the conductive material. In addition, in order to make the component prohibition band as small as possible, it is necessary to arrange same on the edges of the circuit board 5.

Here, in the electronic control device 100 for which waterproofness is required, the waterproof seal material 9 is arranged on the outer periphery. However, in a case where a conductive material (conductive adhesive 1) is set in place on the edges of the circuit board 5, there is mixing between the conductive material and the waterproof seal material 9 arranged on the outer periphery due to spreading during assembly, leading to a reduction in the carbon content of the conductive adhesive 1, and an increased resistance value, which may cause ESD failure. Countermeasures include a countermeasure for preventing mixing between the waterproof seal material 9 and the conductive adhesive 1 by separating same from each other, but in this case, there is a problem that the unit size becomes large.

First Embodiment

Figure 6A:
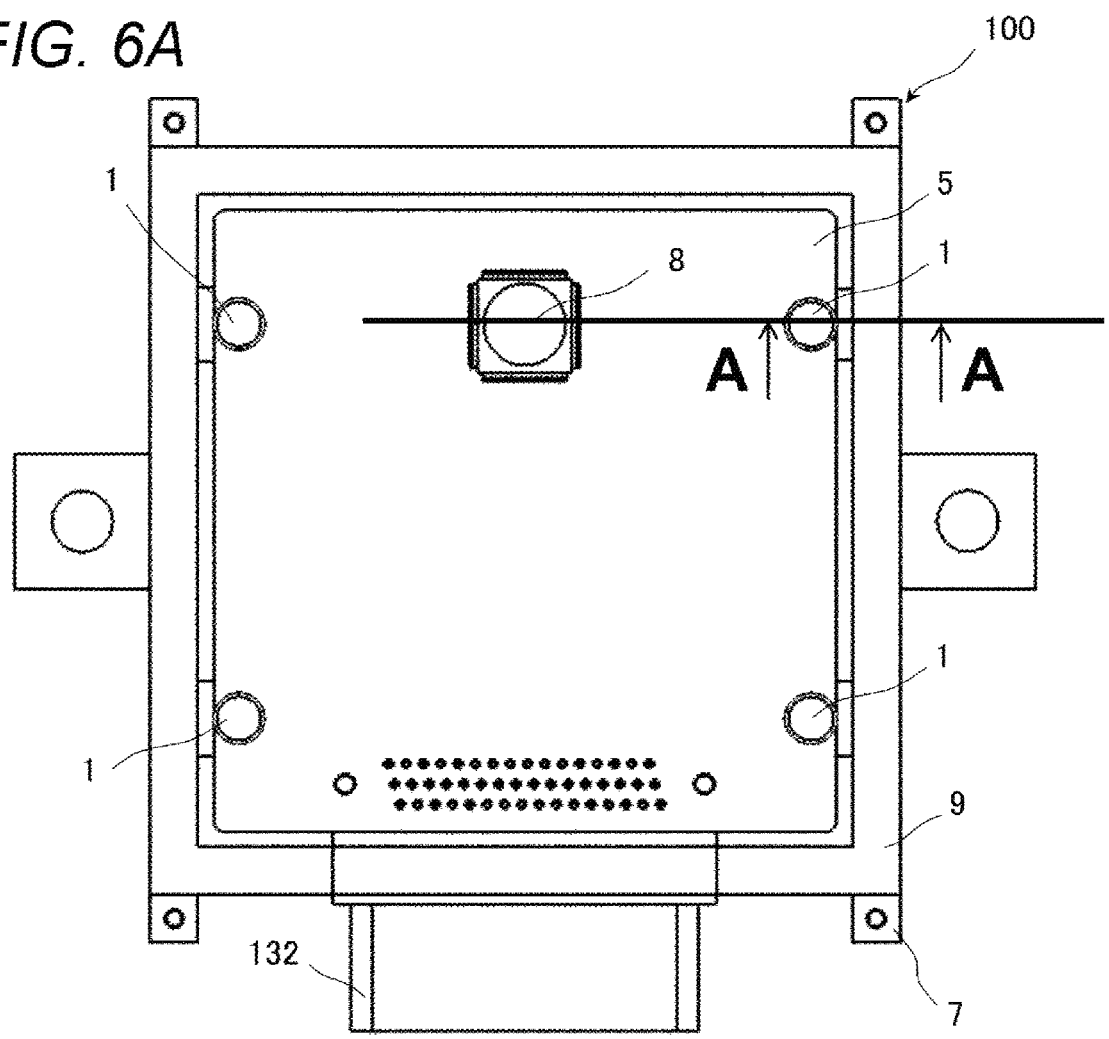
FIG. 6A is a top view of the electronic control device according to the first embodiment of the present invention.
Figure 6B:
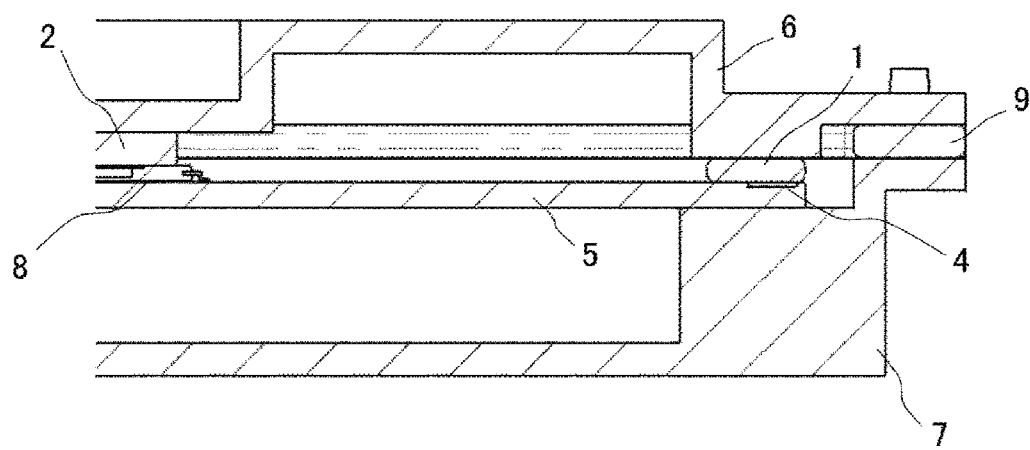
FIG. 6B is a cross-sectional view of the electronic control device shown in FIG. 6A.

As shown in FIGS. 6A and 6B, for example, a conductive adhesive 1 that electrically connects the metal housing 6 to the circuit board 5 is arranged at four or more points on the circuit board 5.

Specifically, the electronic control device 100 includes at least a non-conductive resin housing 7, a circuit board 5, a metal housing 6, a waterproof seal material 9, and a conductive adhesive 1. The circuit board 5 has a circuit ground (GND pattern 4), and is held by the resin housing 7. The metal housing 6 covers the circuit board 5 and is attached to the resin housing 7. The waterproof seal material 9 seals and waterproofs the resin housing 7 and the metal housing 6. The conductive adhesive 1 is in contact with the metal housing 6 and the circuit ground (GND pattern 4), and electrically connects the metal housing 6 to the circuit ground at a plurality of points. As a result, static electricity applied to the metal housing 6 can be discharged to the circuit ground at a low impedance.

That is, when static electricity is applied to metal housing 6, because the static electricity can be reliably made to flow to the circuit ground (GND pattern 4), damage to electronic component 8 can be prevented.

According to the present embodiment, the conductive adhesive 1 electrically connects the metal housing 6 to the circuit ground (GND pattern 4) at four or more points. In the example of FIG. 6A, because the electronic component 8 is near the upper edge (side) of the circuit board 5 in FIG. 6A and the connector 132 is near the lower edge (side) of the circuit board 5 in FIG. 6A, the conductive adhesive 1 is arranged near the left and right edges (sides) of the circuit board 5. Because there are two conductive adhesives 1 on each of the left and right edges (sides) of the circuit board 5, static electricity can be discharged even if a conductive defect occurs in one of the two conductive adhesives 1 of each edge (side).

That is, by arranging the conductive adhesive 1 on the circuit board 5 at a minimum of four or more points, it is possible to reliably conduct static electricity to the circuit ground regardless of where static electricity is applied on the metal housing 6, and even when adhesive failure of the conductive adhesive 1 occurs in the metal housing 6 or the circuit board 5 after assembly, because the conductive adhesive 1 is arranged at four or more points, the occurrence of ESD failure can be suppressed, thereby realizing a highly reliable electronic control device 100.

Note that the conductive adhesive 1 is located on the edges of the circuit board 5. Thus, short-circuits can be prevented.

Second Embodiment

Figure 7A:
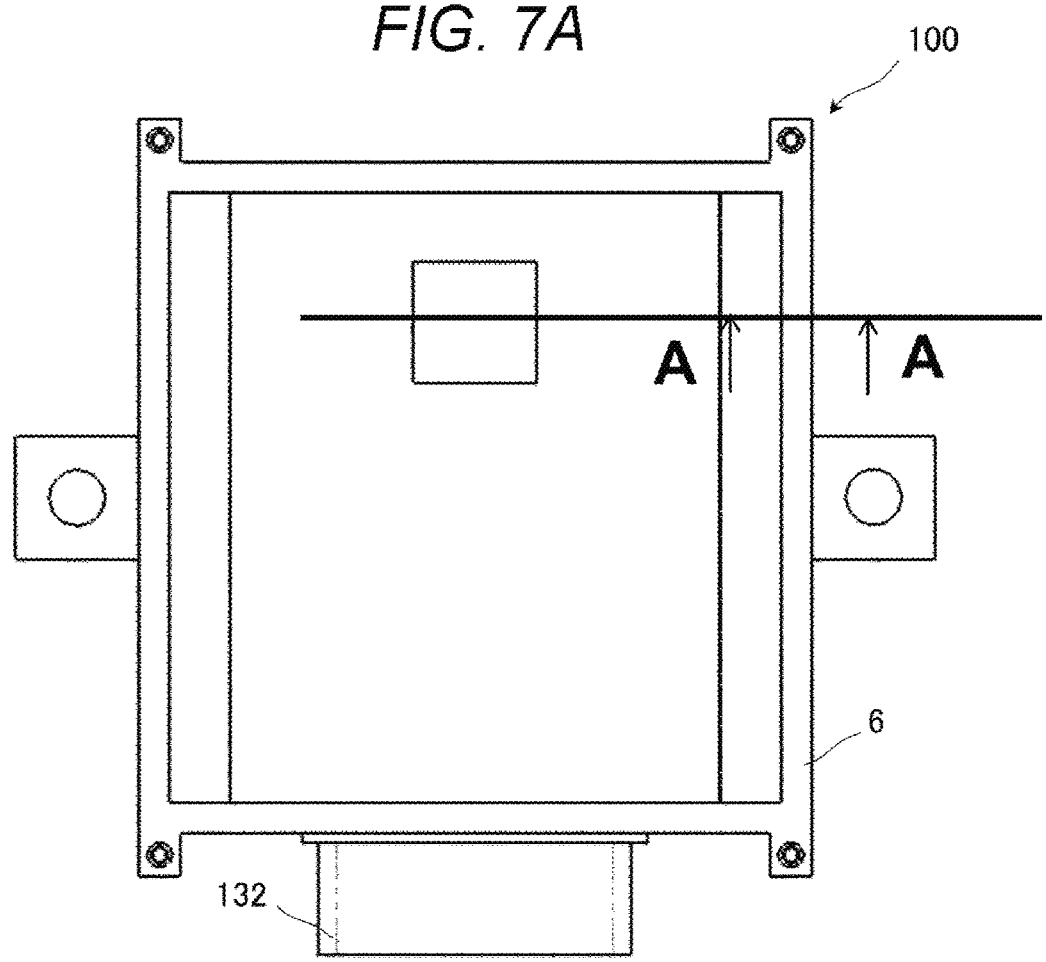
FIG. 7A is a top view of the electronic control device according to a second embodiment of the present invention.
Figure 7B:
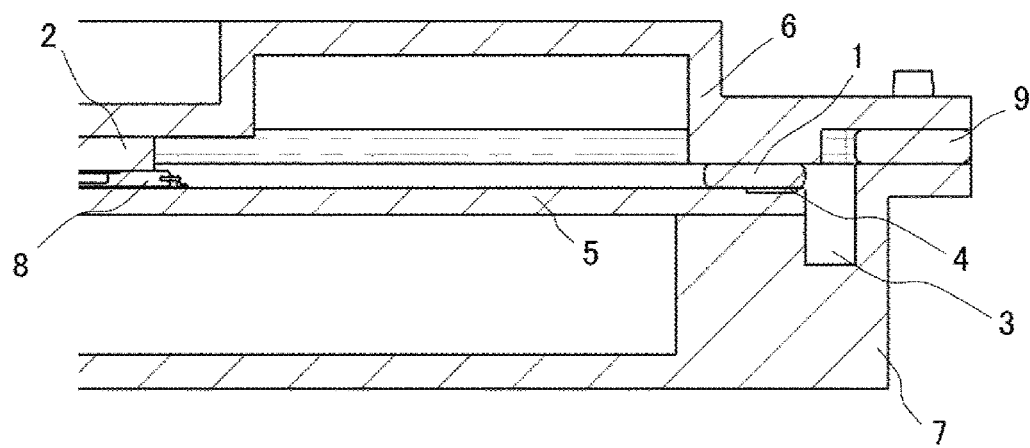
FIG. 7B is a cross-sectional view of the electronic control device shown in FIG. 7A.

As illustrated in FIGS. 7A and 7B, for example, a depression 3 is set between a conductive adhesive 1 disposed on a circuit board 5 and a waterproof seal material 9 disposed on the outer periphery of the circuit board 5. That is, an electronic control device 100 includes a recess (depression 3) provided between the waterproof seal material 9 and the conductive adhesive 1.

Thus, mixing between the waterproof seal material 9 and the conductive adhesive 1 is prevented without enlarging the unit size, thus reliably suppressing the occurrence of ESD failure, and thereby realizing a highly reliable electronic control device 100.

Third Embodiment

Figure 8A:
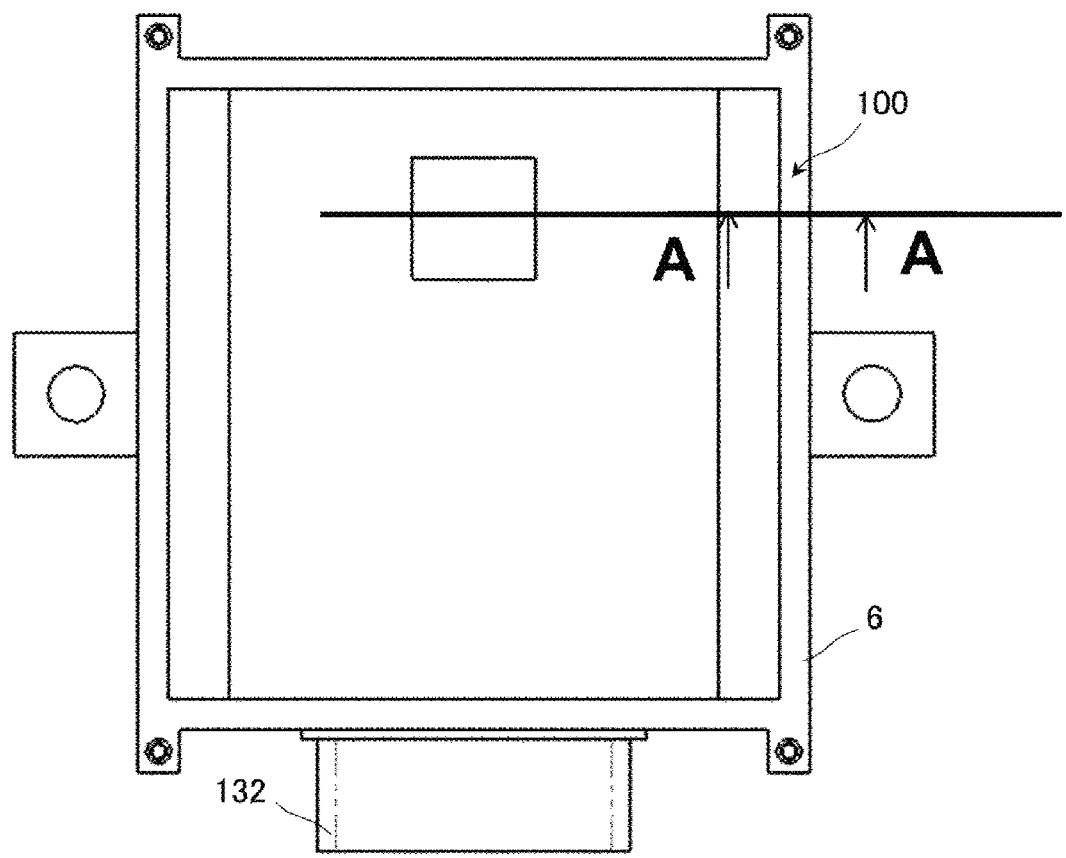
FIG. 8A is a top view of the electronic control device according to a third embodiment of the present invention.
Figure 8B:
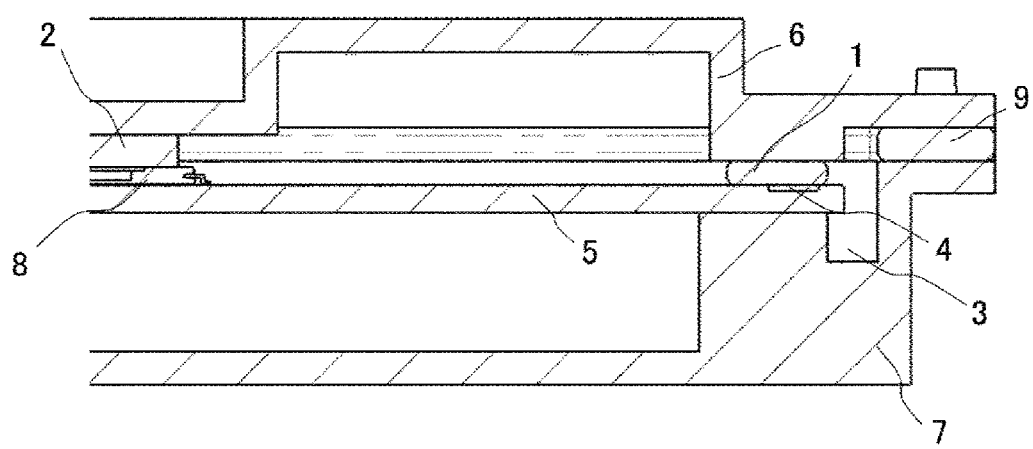
FIG. 8B is a cross-sectional view of the electronic control device shown in FIG. 8A.

The form of the second embodiment is a structure in which, as illustrated in FIGS. 8A and 8B, for example, the depression 3 provided between the conductive adhesive 1 arranged on the circuit board 5 and the waterproof seal material 9 is configured to penetrate to the underside of the circuit board 5. In other words, the recess is the depression 3 provided in the resin housing 7, and the depression 3 penetrates below the circuit board 5.

As a result, because the unit size can be made more compact than that of the second embodiment and mixing between the waterproof seal material 9 and the conductive adhesive 1 can be prevented, the occurrence of ESD failure can be more reliably prevented, thereby realizing a highly reliable electronic control device.

Fourth Embodiment

Figure 9A:
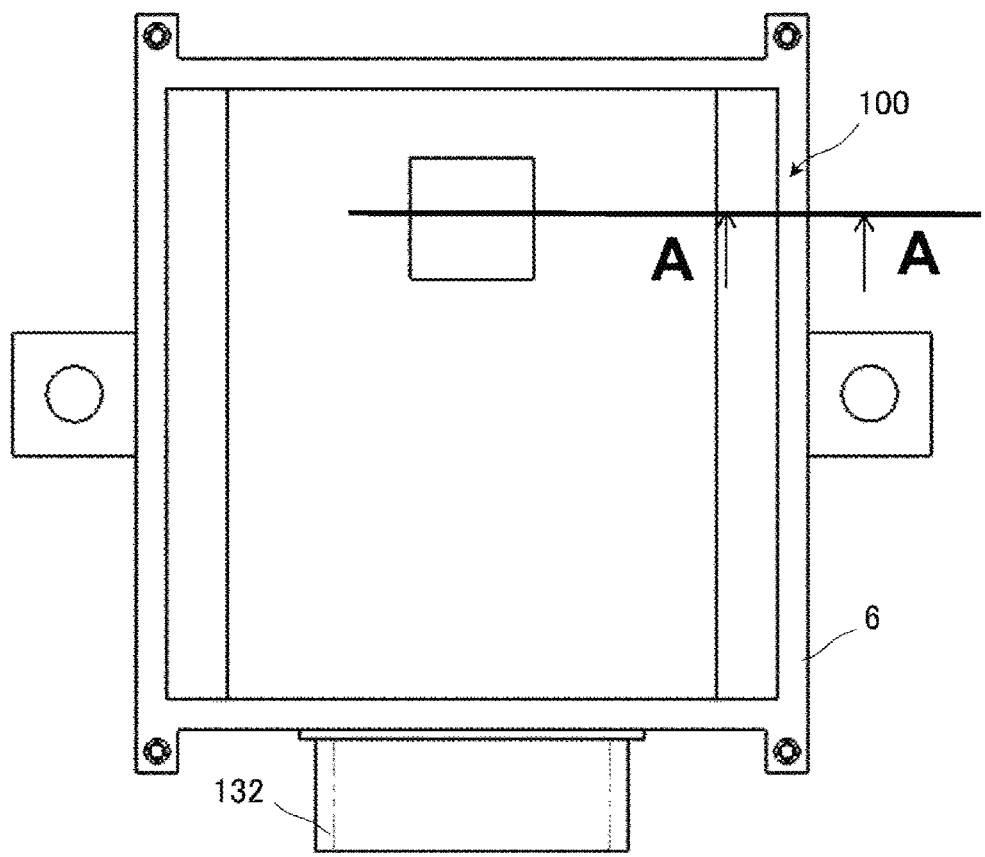
FIG. 9A is a top view of the electronic control device according to a fourth embodiment of the present invention.
Figure 9B:
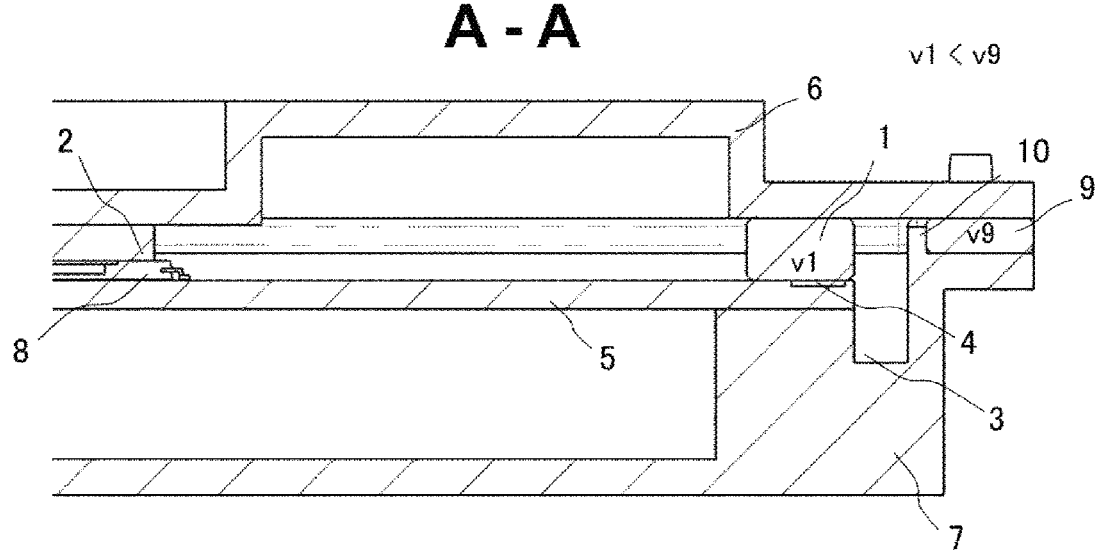
FIG. 9B is a cross-sectional view of the electronic control device shown in FIG. 9A.

The form of the second embodiment is such that, as illustrated in FIGS. 9A and 9B, for example, a wall 10 is provided on the waterproof seal material 9 side, and a depression 3 is provided on the conductive adhesive 1 side. As a result, the wet-spreading of the waterproof seal material 9 is suppressed by the wall 10, and the wet-spreading conductive adhesive 1 falls into the depression 3, thereby preventing mixing between the waterproof seal material 9 and the conductive adhesive 1.

In addition, in comparison with the second embodiment, by providing the wall 10, the unit size can be made more compact, and ESD countermeasures can be obtained. In other words, the electronic control device 100 includes the protrusion (wall 10) adjacent to the inner wall of the recess (depression 3) on the waterproof seal material 9 side. As a result, because the waterproof seal material 9 hardly flows into the recess (depression 3), the size of the recess can be reduced by taking into account only the inflow of the conductive adhesive 1.

Note that, according to the present embodiment, the viscosities of the conductive adhesive 1 and the waterproof seal material 9 are v1 and v9, respectively, with v9 being larger than v1. Further, the protrusion (wall 10) is adjacent to the inner wall of the recess (depression 3) on the side with the higher viscosity (waterproof seal material 9) of the conductive adhesive 1 and the waterproof seal material 9. As a result, the conductive adhesive 1 having low viscosity easily flows into the recess (depression 3).

Fifth Embodiment

Figure 10A:
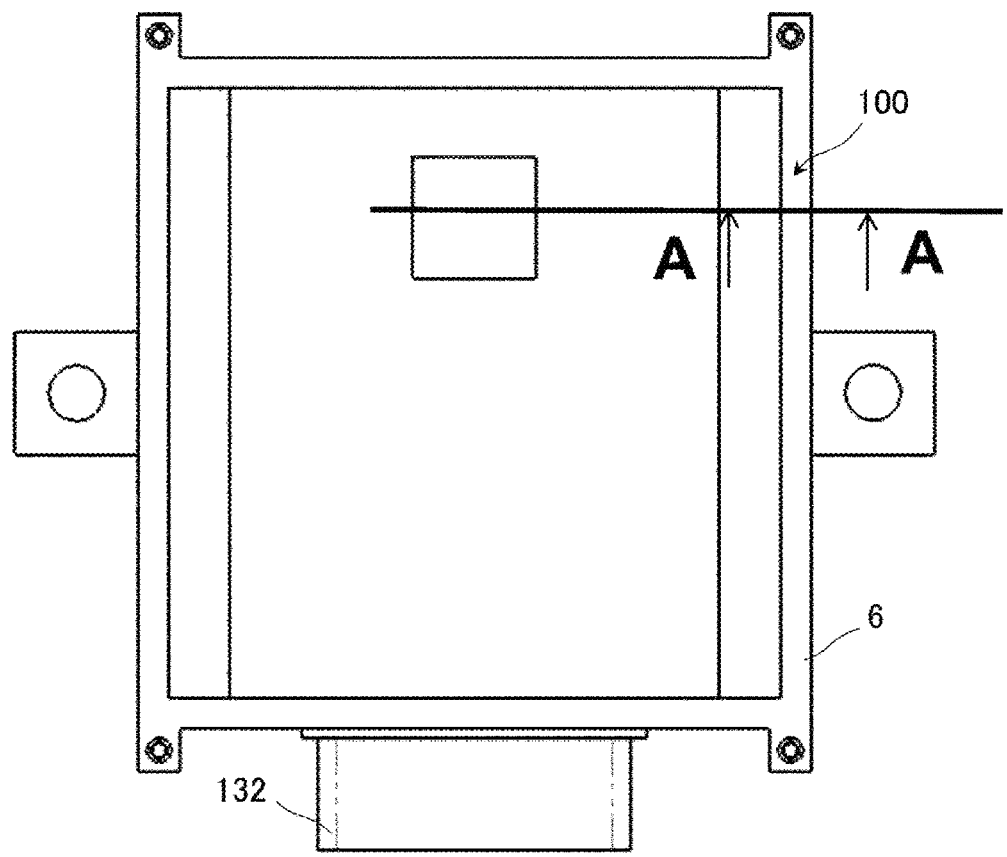
FIG. 10A is a top view of the electronic control device according to a fifth embodiment of the present invention.
Figure 10B:
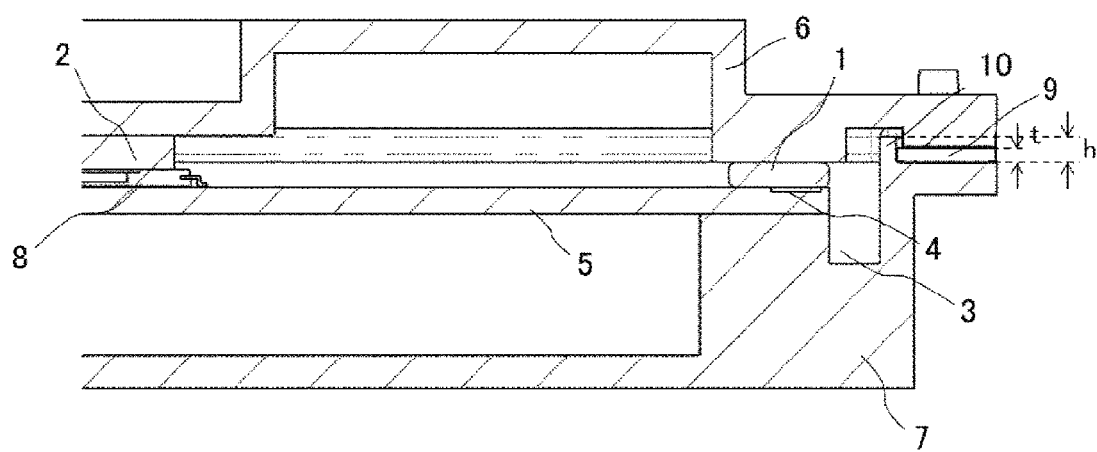
FIG. 10B is a cross-sectional view of the electronic control device shown in FIG. 10A.

The form of the fourth embodiment is such that, as illustrated in FIGS. 10A and 10B, for example, the height h of the wall 10 is set greater than the thickness t of the waterproof seal material with respect to the metal housing 6. That is, the height h of the protrusion (wall 10) is greater than the thickness t of the waterproof seal material 9.

As a result, the spread of the waterproof seal material can be more reliably suppressed than in the fourth embodiment, thereby realizing a highly reliable electronic control device.

Sixth Embodiment

Figure 11A:
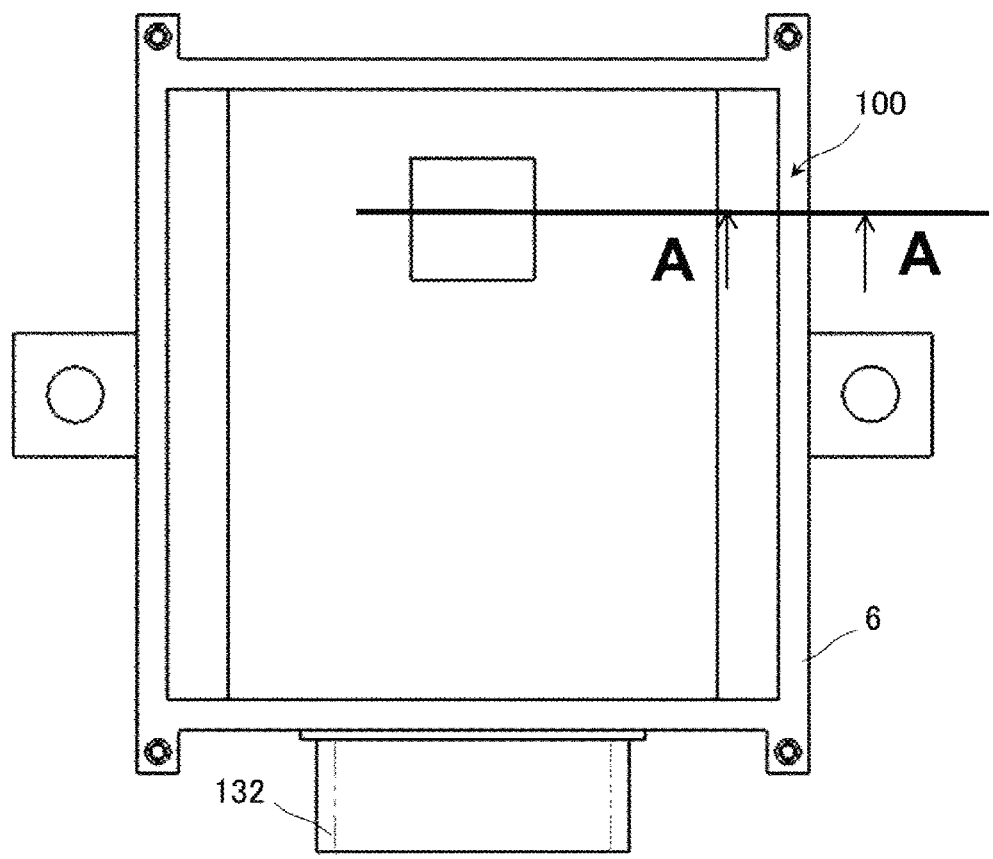
FIG. 11A is a top view of the electronic control device according to a sixth embodiment of the present invention.
Figure 11B:
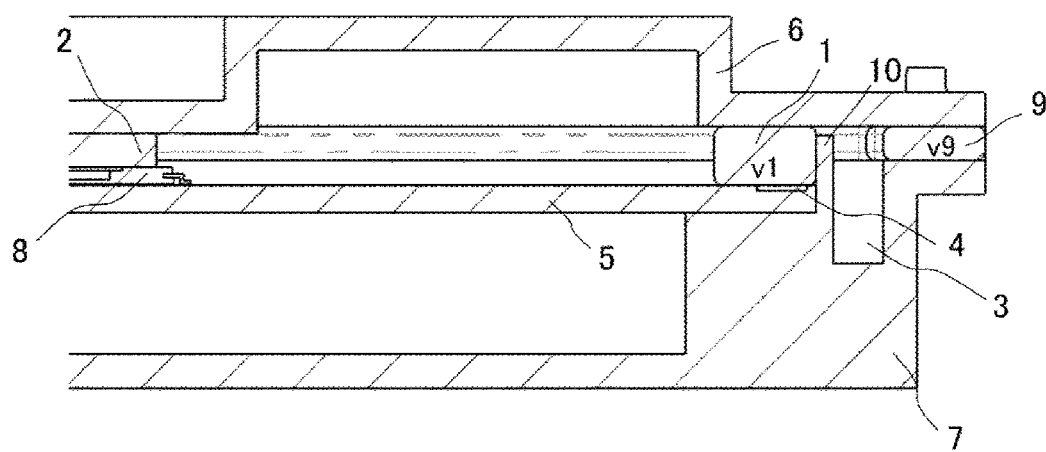
FIG. 11B is a cross-sectional view of the electronic control device shown in FIG. 11A.

In the form of the fourth embodiment, as illustrated in FIGS. 11A and 11B, for example, the depression 3 is provided on the waterproof seal material 9 side, and the wall 10 is provided on the conductive adhesive 1 side. In other words, the protrusion (wall 10) is provided in the resin housing 7 and is adjacent to the inner wall of the recess (depression 3) on the conductive adhesive 1 side.

As a result, the wet-spread waterproof seal material 9 falls into the depression 3, and the wet-spread conductive adhesive 1 is suppressed by the wall 10, thereby yielding the same advantageous effect as that of the fourth embodiment. In addition, the wall 10 according to the present embodiment can also be used as a positioning mechanism of the circuit board 5 at the time of assembly.

Note that, according to the present embodiment, the viscosities of the conductive adhesive 1 and the waterproof seal material 9 are v1 and v9, respectively, with v1 being larger than v9. Further, the protrusion (wall 10) is adjacent to the inner wall of the recess (depression 3) on the side with the higher viscosity (the conductive adhesive 1) among the conductive adhesive 1 and the waterproof seal material 9. As a result, the waterproof seal material 9 with the small viscosity easily flows into the recess (depression 3).

Seventh Embodiment

Figure 12A:
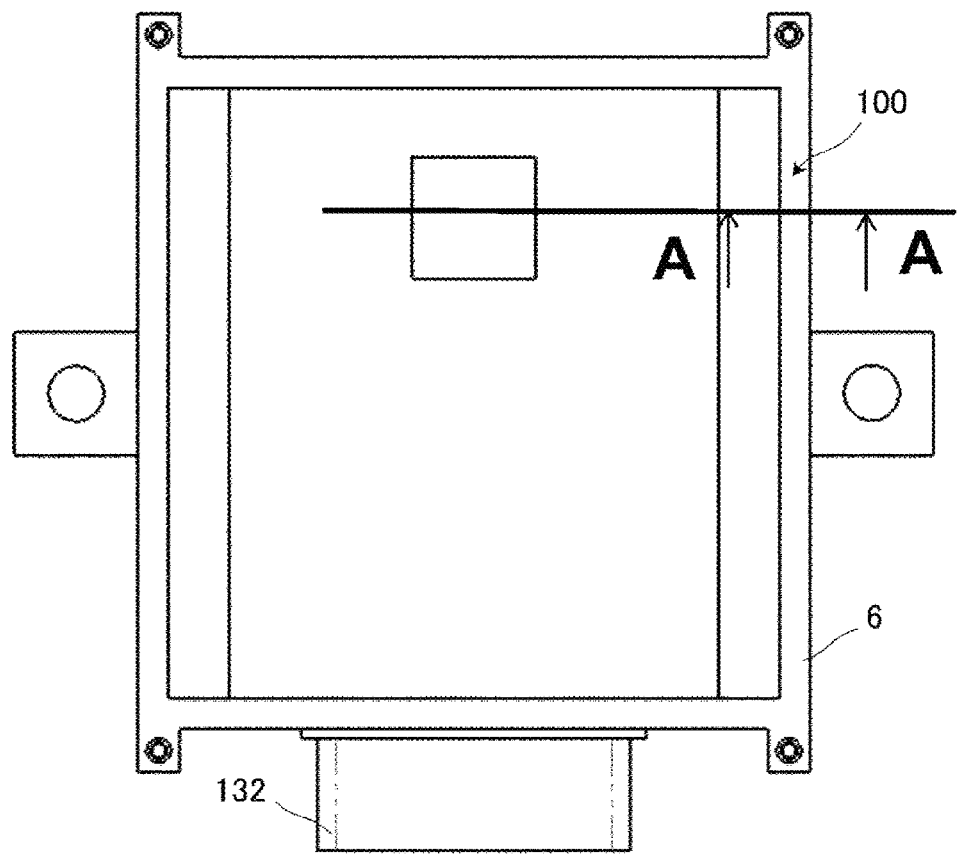
FIG. 12A is a top view of the electronic control device according to a seventh embodiment of the present invention.
Figure 12B:
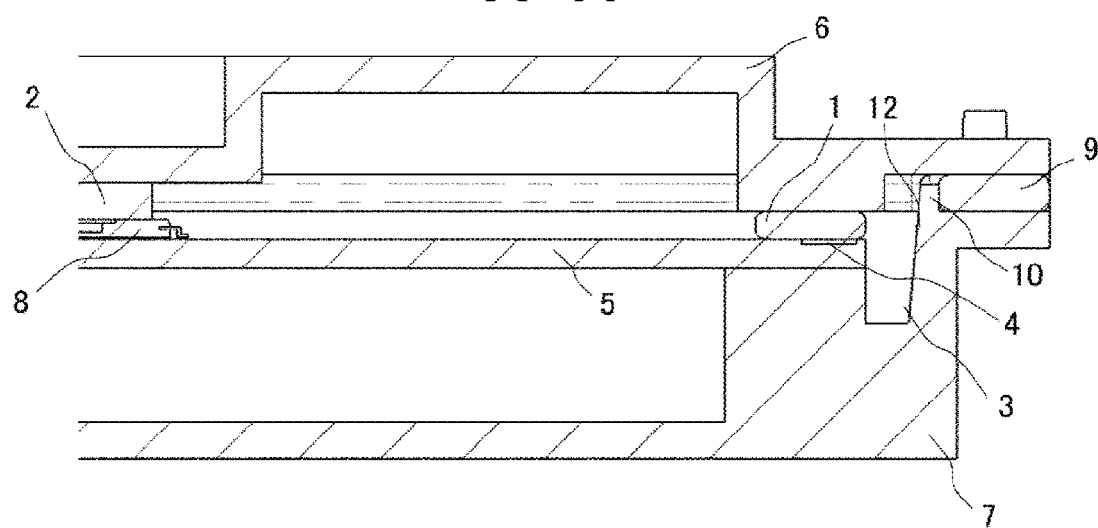
FIG. 12B is a cross-sectional view of the electronic control device shown in FIG. 12A.

The forms of the fourth, fifth, and sixth embodiments are such that, as illustrated in FIGS. 12A and 12B, for example, the wall 10 is provided with a taper 12. In other words, the protrusion (wall 10) is provided with the taper 12.

As a result, improvement in the moldability of the wall 10 provided in the resin housing 7 can be expected while yielding the same advantageous effects as those of the fourth, fifth, and sixth embodiments, and thus, it is possible to reduce the defect occurrence rate during molding.

The shape of the depression 3 of the fourth, fifth, sixth, and seventh embodiments can vary. For example, as illustrated in FIGS. 13A, 13B, and 13C, the shape of the depression 3 is rectangular, arcuate, or U-shaped.

Figure 13A:
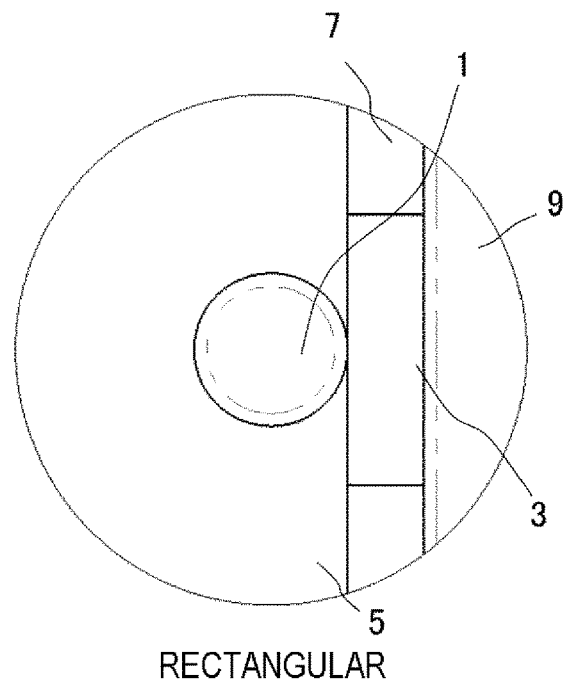
FIG. 13A is a top view of the vicinity of a rectangular depression of an electronic control device according to an example of the present invention.

In the example of FIG. 13A, the cross-section of the recess (depression 3) as viewed in the depth direction is rectangular. Thus, processing of the recess (depression 3), for example, is straightforward.

Figure 13B:
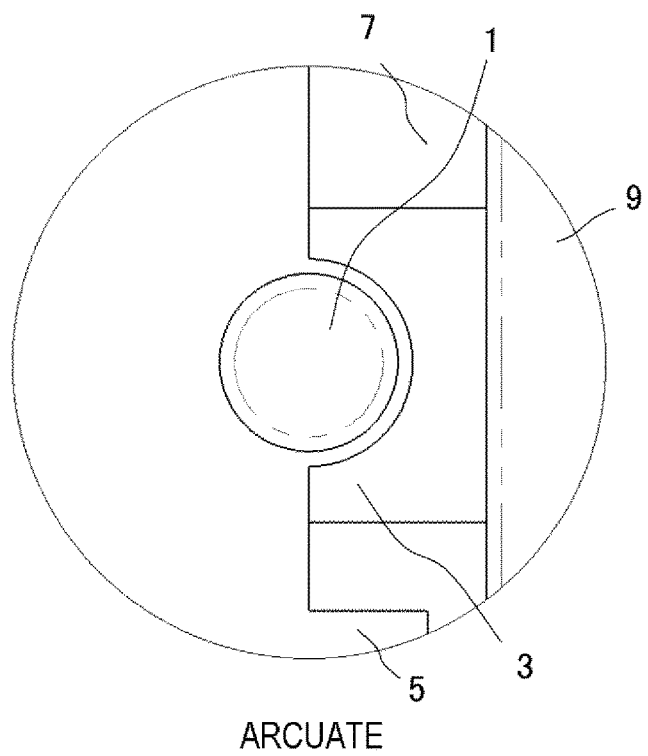
FIG. 13B is a top view of the vicinity of an arcuate depression of the electronic control device according to an example of the present invention.

In the example of FIG. 13B, the cross-section of the recess (depression 3) as viewed in the depth direction includes an arcuate shape. Specifically, the cross-section of the recess (depression 3) as viewed in the depth direction includes a curve along the outer periphery of the conductive adhesive 1. As a result, the conductive adhesive 1 easily flows into the recess (depression 3) in a radial shape.

Figure 13C:
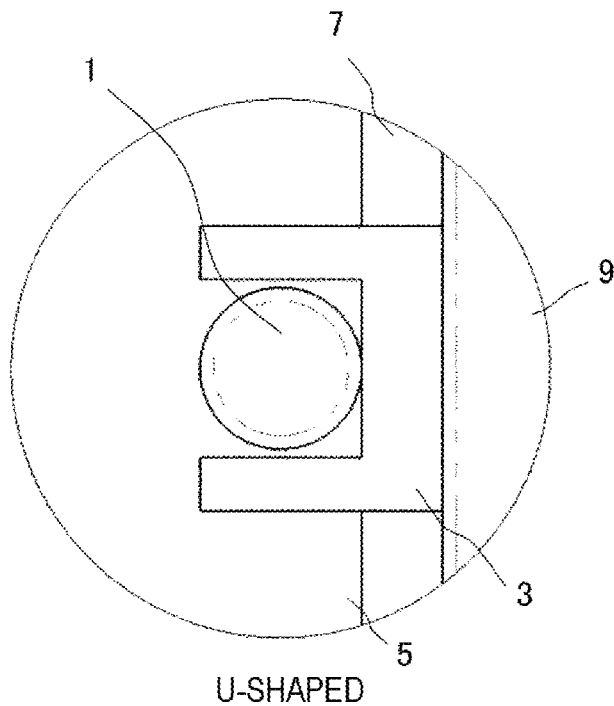
FIG. 13C is a top view of the vicinity of a C-shaped depression of the electronic control device according to an example of the present invention.

In the example of FIG. 13C, the cross-section of the recess (depression 3) as viewed in the depth direction is U-shaped (U shape). Specifically, the cross-section of the recess (depression 3) as viewed in the depth direction includes three straight lines surrounding the conductive adhesive 1. As a result, for example, there is no wet-spreading of the conductive adhesive 1 in the longitudinal direction of the circuit board 5 of FIG. 13C.

Further, the foregoing, when applied to the fourth, fifth, sixth, or seventh embodiments, yields the same advantageous effects as those described with respect to each of the fourth, fifth, sixth, and seventh embodiments.

Eighth Embodiment

Figure 14A:
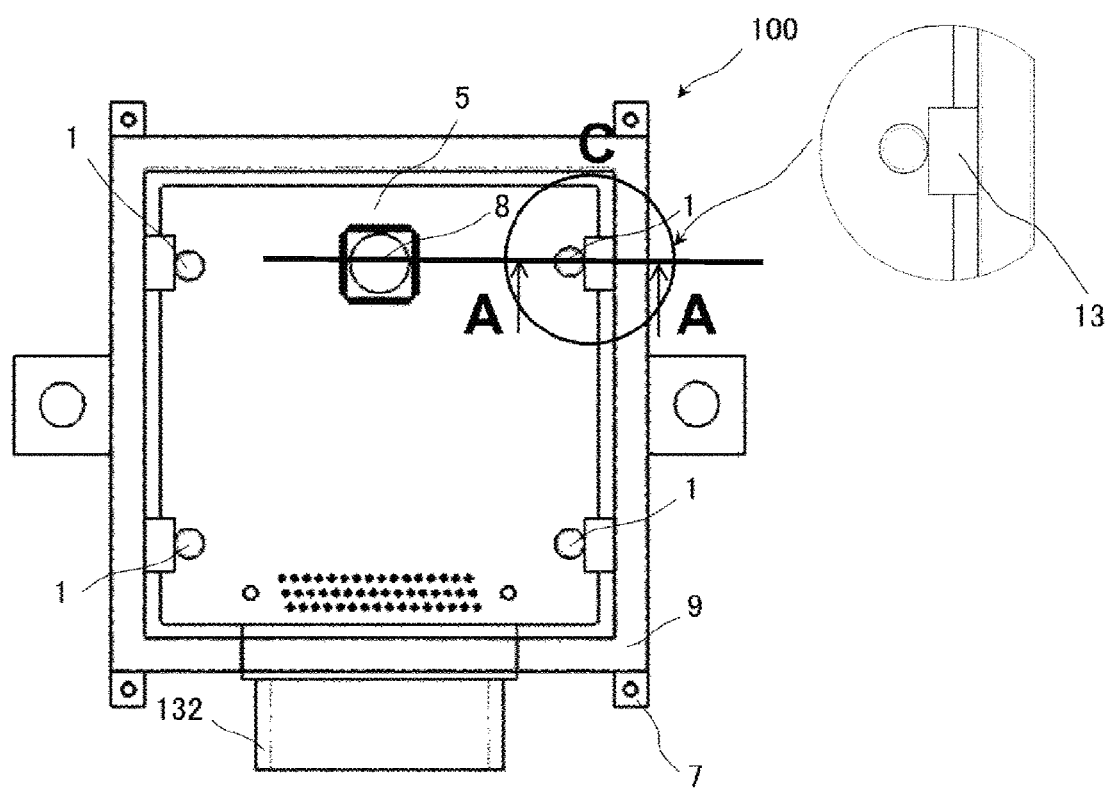
FIG. 14A is a top view of an electronic control device according to an eight embodiment of the present invention.
Figure 14B:
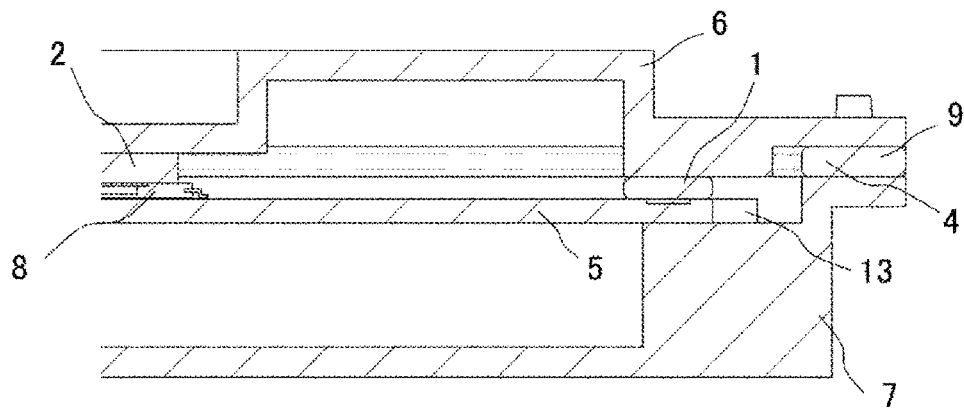
FIG. 14B is a cross-sectional view of the electronic control device shown in FIG. 14A.

As illustrated in FIGS. 14A and 14B, a notch 13 is provided in the circuit board, and a space is provided between the waterproof seal material 9 and the conductive adhesive 1. In other words, the recess is the notch 13 provided in the circuit board 5.

As a result, the wet-spread conductive adhesive 1 falls into this space, thereby yielding the same advantageous effect as that of the fourth embodiment. Further, by not providing the depression 3 formed of the resin housing 7, improvement in the moldability of the resin housing 7 can be expected.

Note that the circuit board 5 is provided below the surface of the resin housing 7 in contact with the waterproof seal material 9. As a result, for example, the distance until the waterproof seal material 9 reaches the notch 13 is then long.

Ninth Embodiment

Figure 15A:
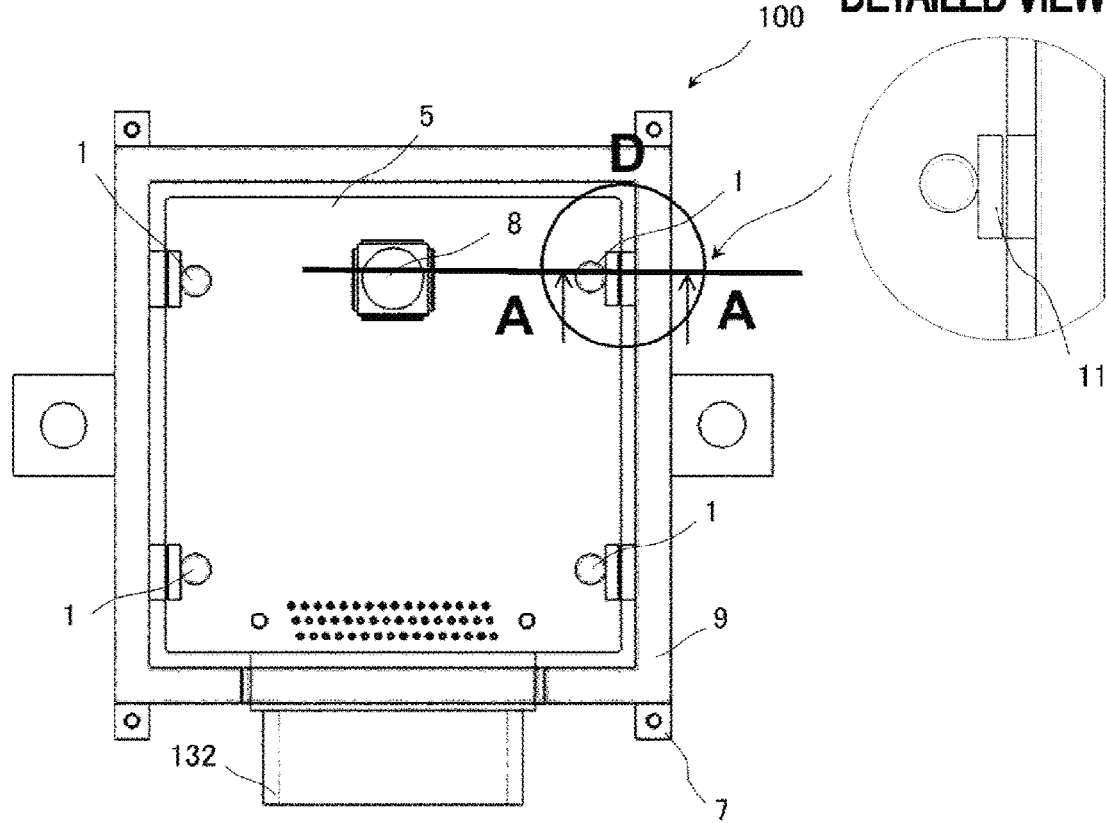
FIG. 15A is a top view of an electronic control device according to a ninth embodiment of the present invention.
Figure 15B:
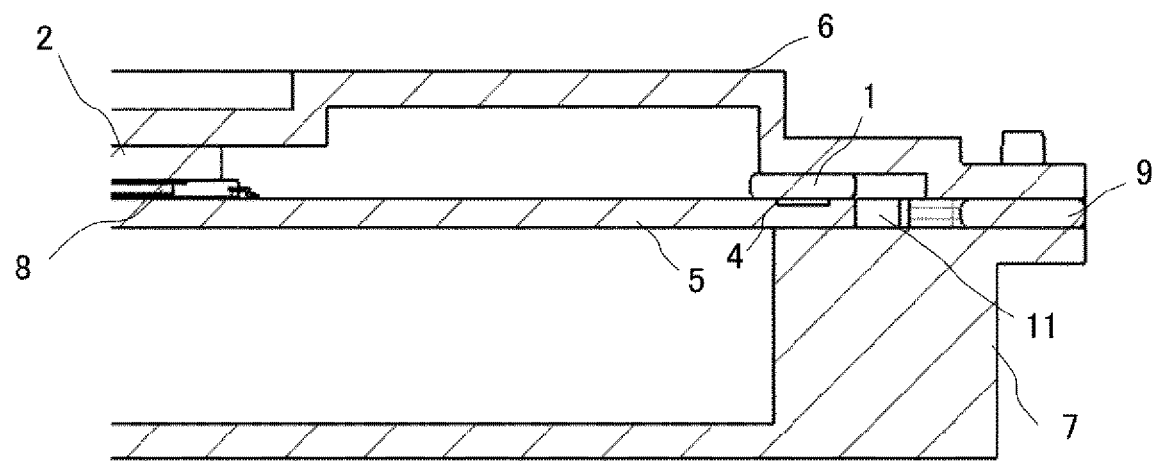
FIG. 15B is a cross-sectional view of the electronic control device shown in FIG. 15A.

As illustrated in FIGS. 15A and 15B, for example, a pit 11 is set in the circuit board 5 between the waterproof seal material 9 and the conductive adhesive 1. In other words, the recess is the pit 11 provided in the circuit board 5.

As a result, the wet-spread waterproof seal material 9 is suppressed by the thickness of the circuit board 5, and the conductive adhesive 1 falls into the pit 11 formed in the circuit board 5, thereby yielding the same advantageous effect as that of the fourth embodiment. Further, by not providing the wall 10 formed of the resin housing 7, or the depression 3, improvement in the moldability of the resin housing can be expected.

Note that the surface of the resin housing 7 in contact with the waterproof seal material 9 and the surface of the resin housing 7 in contact with the circuit board 5 are on one plane. Thus, for example, the electronic control device can be easily assembled.

The form of the pit 11 of the ninth embodiment can vary. For example, as illustrated in FIGS. 16A, 16B, and 16C, the form of the pit 11 formed on the substrate is rectangular, arcuate, or U-shaped.

Figure 16A:
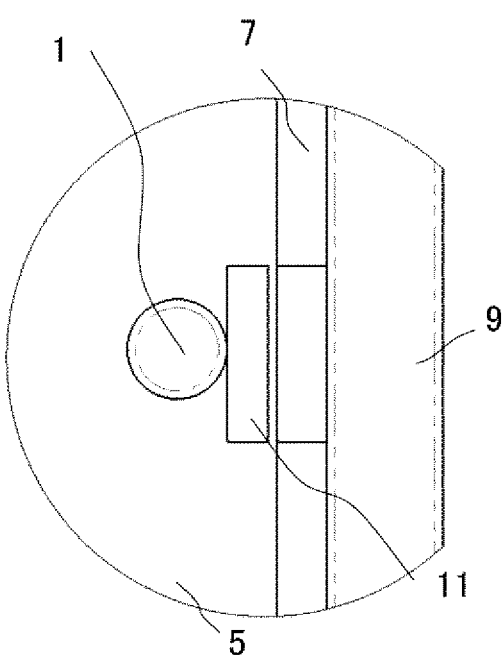
FIG. 16A is a top view of the vicinity of a rectangular pit of an electronic control device according to an example of the present invention.

In the example of FIG. 16A, the cross-section of the recess (pit 11) as viewed in the depth direction is rectangular. As a result, for example, processing of the recess (pit 11) becomes easy.

Figure 16B:
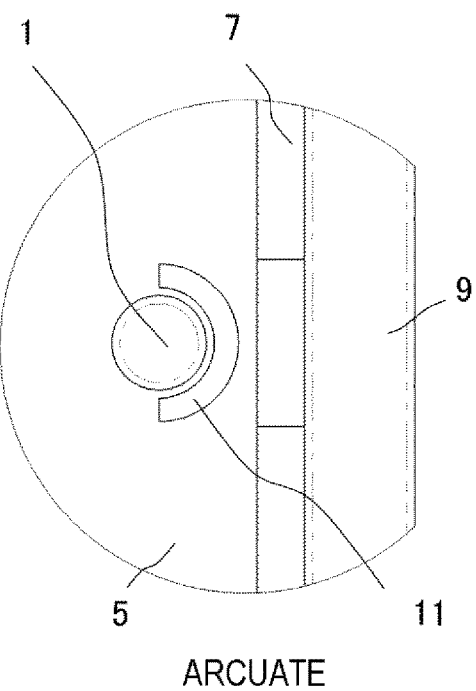
FIG. 16B is a top view of the vicinity of an arcuate pit of the electronic control device according to an example of the present invention.

In the example of FIG. 16B, the cross-section of the recess (pit 11) as viewed in the depth direction includes an arcuate shape. Specifically, the cross-section of the recess (pit 11) as viewed in the depth direction includes a curve along the outer periphery of the conductive adhesive 1. As a result, the conductive adhesive 1 easily flows into the recess (pit 11) in a radial shape.

Figure 16C:
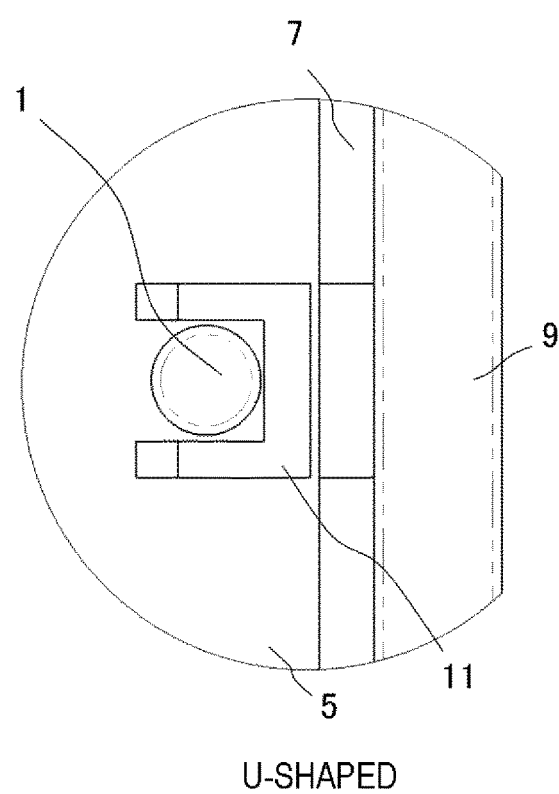
FIG. 16C is a top view of the vicinity of a C-shaped pit of the electronic control device according to an example of the present invention.

In the example of FIG. 16C, the cross-section of the recess (pit 11) as viewed in the depth direction is U-shaped (U shape). Specifically, the cross-section of the recess (pit 11) as viewed in the depth direction includes three straight lines surrounding the conductive adhesive 1. As a result, for example, there is no wet-spreading of the conductive adhesive 1 in the longitudinal direction of the circuit board 5 of FIG. 16C.

In addition, the foregoing yields, regardless of which form of the pit 11 is used, the same advantageous effect as that of the ninth embodiment.

Note that the present invention is not limited to the above-described embodiment, and includes various modifications. For example, the above-described embodiments have been described in detail for easy understanding of the present invention, and are not necessarily limited to those having all the described configurations. Further, part of the configuration of one embodiment can be replaced with the configuration of another embodiment, and the configuration of another embodiment can also be added to the configuration of the one embodiment. In addition, it is possible to add, delete, or substitute other configurations for part of the configuration of each embodiment.

Embodiments of the present invention may have the following modes.

(1). An electronic control device, including: a resin housing 7 formed of a resin material; a circuit board 5 whereon an electronic component 8, which is held by the resin housing 7, is installed; a metal housing 6 that covers the circuit board 5 and that is attached to the resin housing 7; a waterproof seal material 9 provided on the outer peripheral side of the resin housing 7 and the metal housing 6; and a conductive adhesive 1 that electrically connects the circuit board 5 to the metal housing 6, wherein the conductive adhesive 1 connects the circuit board 5 to the metal housing 6 at four or more points.

(2). An electronic control device, including: a resin housing 7 formed of a resin material; a circuit board 5 whereon an electronic component 8, which is held by the resin housing 7, is installed; a metal housing 6 that covers the circuit board 5 and that is attached to the resin housing 7; a waterproof seal material 9 provided on the outer peripheral side of the resin housing 7 and the metal housing 6; a conductive adhesive 1 that electrically connects the circuit board 5 to the metal housing 6; and a depression 3 that is formed of the resin housing 7, between the waterproof seal material 9 and the conductive adhesive 1.

(3). An electronic control device, including: a resin housing 7 formed of a resin material; a circuit board 5 whereon an electronic component 8, which is held by the resin housing 7, is installed; a metal housing 6 that covers the circuit board 5 and that is attached to the resin housing 7; a waterproof seal material 9 provided on the outer peripheral side of the resin housing 7 and the metal housing 6; a conductive adhesive 1 that electrically connects the circuit board 5 to the metal housing 6; and a depression 3 that is formed of the resin housing 7, between the waterproof seal material 9 and the conductive adhesive 1, wherein the depression 3 penetrates below the circuit board 5.

(4). An electronic control device, including: a resin housing 7 formed of a resin material; a circuit board 5 whereon an electronic component 8, which is held by the resin housing 7, is installed; a metal housing 6 that covers the circuit board 5 and that is attached to the resin housing 7; a waterproof seal material 9 provided on the outer peripheral side of the resin housing 7 and the metal housing 6; a conductive adhesive 1 that electrically connects the circuit board 5 to the metal housing 6; a depression 3 that is formed of the resin housing 7, between the waterproof seal material 9 and the conductive adhesive 1; and a protrusion (wall 10) that is formed of the resin housing 7, between the waterproof seal material 9 and the conductive adhesive 1, wherein the depression 3 is formed on the conductive adhesive 1 side, and the protrusion (wall 10) is formed on the waterproof seal material 9 side.

(5). The electronic control device according to (4), wherein the height of the protrusion (wall 10) is greater than the thickness of the waterproof seal material 9.

(6). An electronic control device, including: a resin housing 7 formed of a resin material; a circuit board 5 whereon an electronic component 8, which is held by the resin housing 7, is installed; a metal housing 6 that covers the circuit board 5 and that is attached to the resin housing 7; a waterproof seal material 9 provided on the outer peripheral side of the resin housing 7 and the metal housing 6; a conductive adhesive 1 that electrically connects the circuit board 5 to the metal housing 6; a depression that is formed of the resin housing 7, between the waterproof seal material 9 and the conductive adhesive 1; and a protrusion (wall 10) that is formed of the resin housing 7, between the waterproof seal material 9 and the conductive adhesive 1, wherein the depression 3 is formed on the waterproof seal material 9 side, and the protrusion (wall 10) is formed on the conductive adhesive 1 side.

(7). The electronic control device according to (4) or (5) or (6), wherein the protrusion (wall 10) is provided with a taper 12 (inclination).

(8). The electronic control device according to (2) or (3) or (4) or (5) or (6), wherein the shape of the depression 3 is rectangular.

(9). The electronic control device according to (2) or (3) or (4) or (5) or (6), wherein the shape of the depression 3 is arcuate.

(10). The electronic control device according to (2) or (3) or (4) or (5) or (6), wherein the shape of the depression 3 is a U shape.

(11). An electronic control device, including: a resin housing 7 formed of a resin material; a circuit board 5 whereon an electronic component 8, which is held by the resin housing 7, is installed; a metal housing 6 that covers the circuit board 5 and that is attached to the resin housing 7; a waterproof seal material 9 provided on the outer peripheral side of the resin housing 7 and the metal housing 6; and a conductive adhesive 1 that electrically connects the circuit board 5 to the metal housing 6, wherein a notch 13 is provided in the circuit board 5 between the conductive adhesive 1 and the waterproof seal material 9.

(12). An electronic control device, including: a resin housing 7 formed of a resin material; a circuit board 5 whereon an electronic component 8, which is held by the resin housing 7, is installed; a metal housing 6 that covers the circuit board 5 and that is attached to the resin housing 7; a waterproof seal material 9 provided on the outer peripheral side of the resin housing 7 and the metal housing 6; and a conductive adhesive 1 that electrically connects the circuit board 5 to the metal housing 6, wherein a pit 11 is provided in the circuit board 5 between the conductive adhesive 1 and the waterproof seal material 9.

(13). The electronic control device in (12), wherein the pit 11 is rectangular.

(14). The electronic control device in (12), wherein the pit 11 is arcuate.

(15). The electronic control device in (12), wherein the pit 11 is U-shaped.

(16). The electronic control device in (4) or (5) or (6), wherein, with respect to the conductive adhesive 1 and the waterproof seal material 9, the protrusion (wall 10) is provided on an adhesive with a higher viscosity, and the depression 3 is provided on an adhesive with a lower viscosity.

(17). The electronic control device in (1), wherein the materials of the conductive adhesive 1 and the waterproof seal material 9 are silicone, epoxy, acrylic, urethane, or the like.

(18). The electronic control device in (1), wherein the material of the resin housing 7 is PBT (polybutylene terephthalate), PPS (polyphenylene sulfide), PA (polyamide), POM (polyacetal), or the like.

(19). The electronic control device in (1), wherein the material of the metal housing 6 is A5052, A1050, ADC12, steel, or the like.

According to (1) to (19), it is possible to obtain an inexpensive and reliable ESD countermeasure by using a conductive adhesive, and it is possible to prevent mixing between the conductive adhesive and the waterproof seal material arranged on the outer periphery, even in a case where the unit size is made more compact.

REFERENCE SIGNS LIST

1 Conductive adhesive
2 Heat transfer agent
3 Depression
4 GND pattern
5 Circuit board
6 Metal housing
7 Resin housing
8 Electronic component
9 Waterproof seal material
10 Wall (protrusion)
11 Pit
12 Taper
13 Notch
100 Electronic control device
103 Transmission
131 Transmission case
132 Connector
133 Connecting cable (harness)

The invention claimed is:

1. An electronic control device comprising:
a non-conductive resin housing;
a circuit board having a circuit ground and held by the non-conductive resin housing;
a conductive metal housing that covers the circuit board and that is attached to the non-conductive resin housing;
a waterproof seal material that seals and waterproofs the non-conductive resin housing and the metal housing;
a conductive adhesive that is in contact with the conductive metal housing, the circuit board, and the circuit ground and that electrically connects the conductive metal housing to the circuit ground at a plurality of points; and
a recess provided in the non-conductive resin housing and between the waterproof seal material and the conductive adhesive, and
wherein in a cross-sectional view a first end of the circuit board is a portion of a first inner wall of the recess.

2. The electronic control device according to claim 1, wherein the recess is a depression provided in the non-conductive resin housing, and
wherein the depression penetrates below the circuit board.

3. The electronic control device according to claim 1, comprising:
   a protrusion adjacent to a second inner wall of the recess on the waterproof seal material side.

4. The electronic control device according to claim 3, wherein the height of the protrusion is greater than the thickness of the waterproof seal material.

5. The electronic control device according to claim 3, wherein the protrusion is provided to the non-conductive resin housing.

6. The electronic control device according to claim 3, wherein the protrusion is provided with a taper.

7. The electronic control device according to claim 1, wherein a cross-section of the recess as viewed in the depth direction is rectangular.

8. The electronic control device according to claim 1, wherein the cross-section of the recess as viewed in the depth direction includes an arcuate shape.

9. The electronic control device according to claim 1, wherein the cross-section of the recess as viewed in the depth direction is U-shaped.

10. The electronic control device according to claim 1, wherein the recess is a notch provided to the circuit board.

11. The electronic control device according to claim 1, further comprising
   a pit provided in the circuit board,
   wherein the pit is located at a position next to the recess and between the waterproof seal material and the conductive adhesive.

12. The electronic control device according to claim 1, wherein the conductive adhesive electrically connects the conductive metal housing to the circuit ground at four or more points.

13. The electronic control device according to claim 1, wherein the conductive adhesive is located on edges of the circuit board.

14. An electronic control device comprising:
   a non-conductive resin housing;
   a circuit board having a circuit ground and held by the non-conductive resin housing;
   a conductive metal housing that covers the circuit board and that is attached to the non-conductive resin housing;
   a waterproof seal material that seals and waterproofs the non-conductive resin housing and the metal housing;
   a conductive adhesive that is in contact with the conductive metal housing, the circuit board, and the circuit ground and that electrically connects the conductive metal housing to the circuit ground at a plurality of points; and
   a recess provided in the non-conductive resin housing and between the waterproof seal material and the conductive adhesive,
   wherein the recess includes a protrusion adjacent to one of a first inner wall of the recess on a side with the waterproof seal material or a second inner wall of the recess on a side with the conductive adhesive, and
   wherein the protrusion is adjacent to the first inner wall of the recess when the waterproof seal material has a higher viscosity than the conductive adhesive, and the protrusion is adjacent to the second inner wall of the recess when the conductive adhesive has a higher viscosity than the waterproof seal material.

15. The electronic control device according to claim 14, wherein when the protrusion is adjacent to the first inner wall, a height of the protrusion is greater than the thickness of the waterproof seal material.

16. The electronic control device according to claim 14, wherein the protrusion is provided to the non-conductive resin housing.

17. The electronic control device according to claim 14, wherein the protrusion is provided with a taper.

* * * * *